Figure 1:
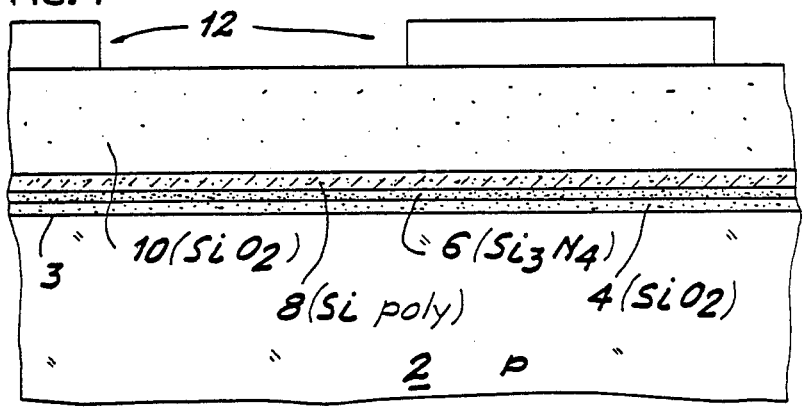

United States Patent [19]

Jeuch

[11] Patent Number: 4,889,828

[45] Date of Patent: Dec. 26, 1989

[54] PROCESS FOR THE PRODUCTION OF ELECTRICAL ISOLATION ZONES IN A CMOS INTEGRATED CIRCUIT

[75] Inventor: Pierre Jeuch, Seyssins, France

[73] Assignee: Commissiriat a L'Energie Atomique, Paris, France

[21] Appl. No.: 249,183

[22] PCT Filed: Jan. 26, 1988

[86] PCT No.: PCT/FR88/00042

§ 371 Date: Aug. 16, 1988

§ 102(e) Date: Aug. 16, 1988

[87] PCT Pub. No.: WO88/05603

PCT Pub. Date: Jul. 28, 1988

[30] Foreign Application Priority Data

Jan. 26, 1987 [FR] France ............................ 87 00860

[51] Int. Cl.$^4$ ............................................. H01L 21/76
[52] U.S. Cl. ........................................ 437/34; 437/67; 437/72; 148/DIG. 105; 156/643; 156/664
[58] Field of Search ................... 437/61, 67, 57, 34, 437/72, 228, 245, 962, 200; 156/643, 644, 664; 357/42; 148/DIG. 103, DIG. 105

[56] References Cited

U.S. PATENT DOCUMENTS

| | | | |
|---|---|---|---|
| 4,546,538 | 10/1985 | Suzuki | 437/67 |
| 4,595,452 | 6/1986 | Landau et al. | 156/643 |
| 4,676,869 | 6/1987 | Lee et al. | 156/643 |

FOREIGN PATENT DOCUMENTS

| | | |
|---|---|---|
| 0098775 | 1/1984 | European Pat. Off. |
| 0113517 | 7/1984 | European Pat. Off. |
| 0132009 | 1/1985 | European Pat. Off. |

OTHER PUBLICATIONS

Miller et al., Solid State Technology (Dec. 1982), pp. 85–90.

Rung et al., IEDM (1982), pp. 237–240.

Kudoh et al., J. Electrochem. Soc.: Solid State Science and Technololgy (Aug. 1986), pp. 1666–1670.

Cham et al., IEDM (1983), pp. 23–26.

Patent Abstracts of Japan, vol. 10, No. 104 (E-397), 19-Apr.-1986, p. 2161 & JP, A, 60244037, 60244043 (Toshiba K.K.) 3—Dec.-1985.

*Primary Examiner*—Olik Chaudhuri
*Attorney, Agent, or Firm*—Oblon, Spivak, McClelland, Maier & Neustadt

[57] ABSTRACT

The CMOS circuit has n regions (20a) and p regions (32a) formed in a silicon substrate (2). A first mask is produced on the substrate, whose patterns (10a) mask the p regions (32a). A second mask (22a) is formed on the substrate masking the n regions (20a). The first mask, whose sides have in their upper part an inclined profile, can be selectively etched with respect to the second mask. The patterns of the first and second masks are separate and fix between them the location and width of the isolation trenches (24). The trenches are formed by etching the substrate and simultaneous etching takes place of the first mask and the substrate for forming in the upper part (24a) of each trench and in contact with the p regions, sides (26) inclined with respect to the upper surface of the substrate, so that the section of the trenches (24) widens towards said upper substrate surface.

26 Claims, 4 Drawing Sheets

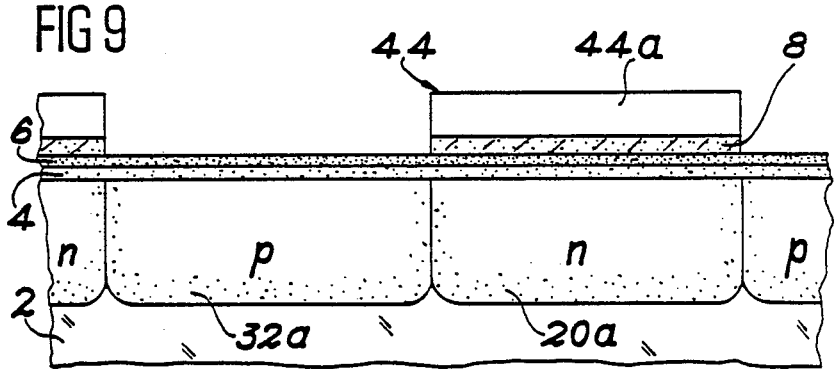
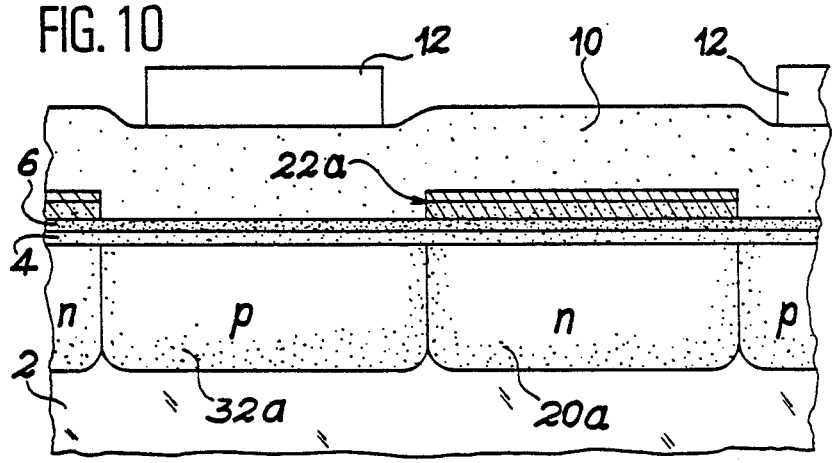
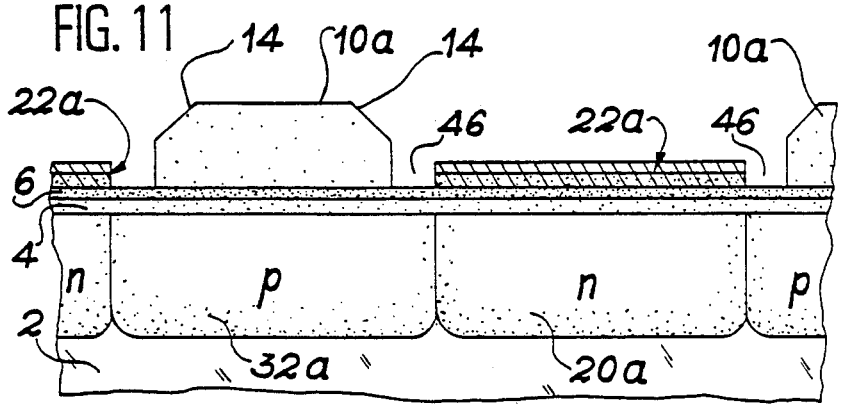

PROCESS FOR THE PRODUCTION OF ELECTRICAL ISOLATION ZONES IN A CMOS INTEGRATED CIRCUIT

DESCRIPTION

The present invention relates to a process for the production of electrical isolation zones in a CMOS integrated circuit.

It more particularly applies to the microelectronics field whenever it is necessary to electrically isolate from one another the n and p components of a circuit (transistors, diodes, etc.) produced on a monocrystalline silicon substrate. The invention can be more particularly used for the production of logic gates, flip-flops, random access or read-only memories, etc.

The search for a high integration density in CMOS integrated circuits requires the use of a special isolation technique between the different components of said circuits and specifically between their n channel transistors and their p channel transistors.

One of the recent isolation techniques used for this purpose is based on producing an isolating trench in the semiconductor substrate, said trench being oxidized and then filled with a material, such as polycrystalline silicon or silicon dioxide. Filling takes place by the deposition of the filling material over the entire surface of the integrated circuit, followed by the removal of the excess of said material deposited outside the trenches. Above the said trench is produced a local field oxide (LOCOS).

This technique of isolation by trench surmounted by a local field oxide has more particularly been described in an IEDM article in 1982, pp 237 to 240 and entitled "Deep Trench Isolated CMOS Devices".

This isolation technique makes it possible to achieve considerable isolation depths (several micrometres) between the different integrated circuit components, whilst ensuring a good surface isolation and whilst preventing the short-circuiting of the n channel transistors and the p channel transistors, said phenomenon being known as latch up.

Unfortunately, in such an isolation technique, the problem arises of an inversion of the electrical conductivity on the sides of the isolation trenches and therefore of the formation of parasitic channels, when the end of the channels of the transistors touch the trenches, where the transistor gates pass on to the latter. This problem of parasitic channels is more particularly described in an IEDM article in 1983, pp 23 to 26 and entitled "Characterization and Modelling of the Trench Surface Inversion Problem for the Trench Isolated CMOS Technology" by Kit M. CHAM et al. It makes it necessary to move the transistors away from the isolation trenches and more particularly the n channel transistors of said circuits, by producing a field oxide region between the trenches and the transistors at the place where the gate of said transistors passes onto the corresponding lateral isolation thereof, thus limiting the integration density of the said circuits.

Moreover, the positioning of isolation trenches between the n regions and the p regions of the substrate in which will be respectively produced the p channel transistors and the n channel transistors of the integrated circuit requires the use of several lithography masks, one mask for defining the location of the n regions and another mask for defining the location of the p regions, which are difficult to reciprocally position and which bring about a further limitation to the integration density of the CMOS circuits.

The present invention relates to a process for the production of electrical isolation zones in an integrated CMOS circuit making it possible to obviate the various disadvantages referred to hereinbefore.

In particular, the integrated circuit obtained according to the invention and using the procedure of isolating by isolation trenches, has a much higher integration density than that of the prior art CMOS circuits. Moreover, said circuit has no electrical conductivity inversion on the sides of the trenches and therefore no parasitic channels.

More specifically, the present invention relates to a process for the production of electrical isolation zones serving to isolate the n regions from the p regions of a CMOS integrated circuit formed in a silicon substrate, characterized in that it comprises the following stages:

(a) producing a first mask on the substrate having first patterns masking at least partly the p regions, (b) producing a second mask on the substrate having second patterns masking at least partly the n regions, the first mask, whose sides have in their upper part an inclined profile, being selectively etchable with respect to the second mask, the first and second patterns being separate and defining between them the location of the electrical isolation trenches to be produced, (c) etching the unmasked substrate regions for forming the trenches, (d) simultaneously etching the first mask and the substrate for forming, in the upper part of the trenches, inclined sides in contact with the p regions, the section of the trenches widening towards the upper surface of the substrate.

The term "substrate" is understood to mean a solid substrate or a layer epitaxied on a solid substrate.

The use of an isolation trench having asymmetrical sides in particular permits an overdoping of the sides of the trenches in contact with the p regions, thus making it possible to place the n channel transistors of the circuit in contact with the trenches and in particular the n+ active zones of said transistors. This makes it possible to significantly reduce the distance between the n and p regions and consequently increase the integration density of the circuit. Thus, this overdoping makes it possible to avoid any electrical conductivity inversion on the sides of the isolation trenches and in particular on the side of the n channel transistors.

The second mask can be of a silicide, a metal or a random metallic compound other than a silicide and is selectively etchable with respect to the first mask.

According to a preferred embodiment of the invention, the production process comprises the following stages:

(a') producing the first mask on the upper surface of the substrate, whose patterns mask the p regions, (b') etching the first mask so that its sides have an inclined profile in their upper part, (c') producing spacers from a material other than silicon and which can be selectively etched with respect to the first mask on said sides, (d') deposition of a metal or a silicide solely above the regions of the substrate not covered by the first mask and the spacers, (e') elimination of the spacers, (f') etching the regions of the substrate exposed during the preceding stage in order to form trenches, (g') simultaneous etching of the first mask and the substrate for forming, in the upper part of the trenches, inclined sides in contact with the p regions, the section of the trenches widening towards the upper surface of the substrate, (h') filling the trenches with a filling material.

This embodiment of the invention, unlike the prior art, only uses a single resin lithography mask for positioning the isolation trenches with respect to the n regions and the p regions of the integrated circuit. Moreover, said single mask permits an autopositioning of the trenches with respect to the p and n regions of the integrated circuit.

According to a first variant of the inventive process, the silicide is formed above the unmasked substrate regions (stage d') by depositing on the structure obtained a metal layer able to form a silicide, forming a silicide from the metal solely above the unmasked substrate regions and eliminating the metal which has not formed silicide.

According to a second variant of the above process, the metal is deposited above the unmasked substrate regions (stage d') by selective vapour phase chemical deposition of tungsten or palladium. In this case, the spacers and mask can be produced independently of silicon dioxide or nitride.

The inventive process is applicable both to a technology using p type recesses, n type recesses or double n and p recesses.

When using n recesses, particularly in a p type substrate, a type n ion implantation takes place between stages c' and d' for forming n regions and using the mask produced during stage a'.

When using p recesses, particularly in a n type substrate, between stages g' and h' a p type ion implantation takes place using as the mask the metallization or siliciding produced during stage g'.

In the case of a double recess technology, the two aforementioned implantations obviously have to be carried out.

In order to diffuse the implanted n and/or p type ions into the substrate, at least one thermal annealing of the structure takes place. Advantageously, the first mask and the substrate are anisotropically etched at identical etching speeds for the first mask and the substrate.

Prior to stage a', it is advantageous to deposit on the substrate a protective layer and then a polycrystalline silicon layer, the protective layer being made from a material which can be selectively etched with respect to the polycrystalline silicon. The etched protective layer can in particular be used as a mask for producing the local field oxide, which is autopositioned relative to the isolation trenches above which it is produced.

The polycrystalline silicon layer either permits the formation of silicide by reacting with the metal at high temperature, or the selective deposition of tungsten solely above the unmasked substrate regions.

The metal able to form a silicide can be chromium, nickel, cobalt and all refractory metals, such as platinum, palladium, tungsten, titanium, molybdenum, tantalum, etc. Preference is given to the use of platinum or palladium. The silicides of these two metals have a good stopping power for p type ions. Thus, they constitute a good implantation mask for p type ions.

Other features and advantages of the invention can be better gathered from the following description given in an illustrative and non-limitative manner with reference to FIGS. 1 to 8, which diagrammatically show in longitudinal section the different stages of the process for producing a CMOS integrated circuit according to the invention, whilst FIGS. 9 to 11 show a variant of the process. The following description relates to the production of the electrical isolation zones of a CMOS circuit with double n and p recesses produced on a p type semiconductor substrate. Obviously the inventive process has a much more general application, as has been shown hereinbefore.

As shown in FIG. 1, the p type monocrystalline silicon substrate 2 on which will be produced the integrated circuit and its isolation zones is coated on its upper surface 3 with a possible isolating layer 4, preferably of silicon dioxide ($SiO_2$). Said layer 4 can be formed by thermal oxidation of the silicon substrate 2 at a temperature of approximately 900° C. Layer 4 has a thickness of approximately 20 nm.

On said oxide layer 4 is then deposited a possible insulating layer 6, which is preferably of silicon nitride ($Si_3N_4$), which serves as a protective layer for the n and p recesses, as well as for the localization of the subsequently produced field oxide. The thickness of layer 6 is approximately 80 nm and can be obtained by chemical vapour phase deposition (CVD or LPCVD).

The silicon oxide layer 4 serves as a support layer for the silicon nitride layer 6.

The following stage of the process consists of depositing by low pressure chemical vapour phase deposition (LPCVD) an approximately 100 nm thick polycrystalline silicon layer 8, which will be subsequently used for forming the silicide or the selective deposition of tungsten.

This is followed by the deposition of an approximately 2000 nm thick silicon dioxide layer 10 by low pressure chemical vapour phase deposition. On said layer 10 is then formed a resin mask 12 using conventional photolithography processes defining the dimensions and locations of the n recesses or regions in which will be subsequently produced the p channel transistors of the CMOS circuit. Mask 12 represents the image of the n regions and makes it possible to only mask the regions of the substrate in which will be subsequently produced the p regions.

This is followed by etching of mask 12 and the silicon dioxide layer 10 up to the complete elimination of the regions of layer 10 not covered with resin 12. The polycrystalline silicon layer 8 serves as a stopping layer for said etching.

The etching is performed in two stages. The first stage takes place in conventional anisotropic manner over a thickness of approximately 1 $\mu$m. The second stage takes place isotropically for the resin mask 12 and anisotropically for the oxide layer 10. It can in particular be carried out in the manner described in the Journal of the Electrochemical Society, Aug. 1986 entitled "Tapered $SiO_2$ Etch in Diode-Type Reactive Ion Etching", pp 1666–1670.

Figure 2:
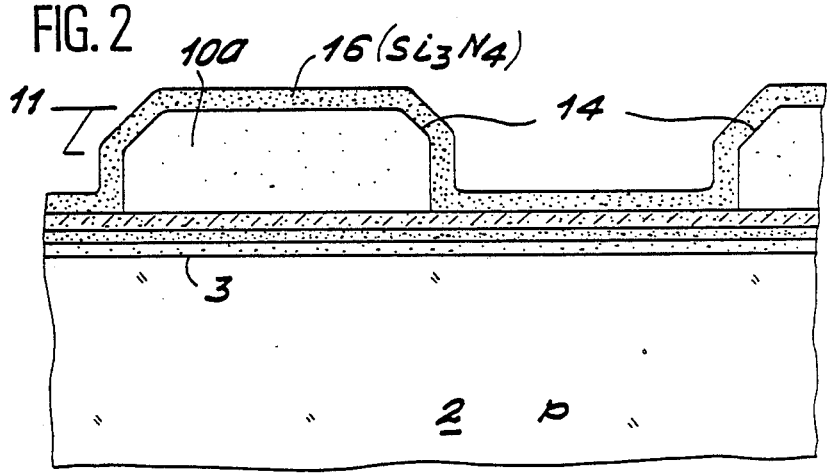

This etching technique makes it possible, in the manner shown in FIG. 2, to obtain an etched silicon dioxide layer 10a having in its upper part 11 inclined sides 14, which are such that the lower surface of the pattern 10a oriented towards the upper surface 3 of substrate 2 is above the opposite surface of said pattern.

This is followed by the elimination of the remainder of resin mask 12 with the aid of an oxygen plasma. The silicon dioxide pattern 10a obtained will subsequently serve as an implantation mask for forming the n regions of the CMOS integrated circuit.

The following stage of the process consists of depositing on the complete structure an approximately 300 nm thick silicon nitride layer 16 using low pressure chemical vapour phase deposition. This is followed by a solid plate anisotropic etching of layer 16 by a reactive ionic etching process using $CHF_3$ as the exemplified etching agent, the polycrystalline silicon layer 8 serving to stop said etching.

Figure 3:
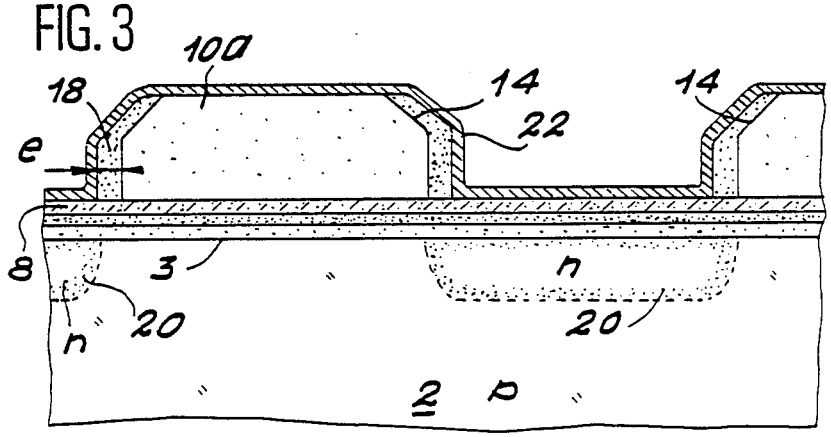

Solid plate etching makes it possible to obtain on the sides of the mask 10a and as shown in FIG. 3, spacers 18, whose thickness e is equal to the thickness of the silicon nitride layer 16, i.e. 300 nm. These spacers 18 define the width of the isolation trenches to be formed in substrate 2.

With the aid of the silicon dioxide mask 10a and the spacers 18, a n type ion implantation takes place with a view to forming n regions 20 in which the p channel transistors will be subsequently produced. Said ionic implantation can be carried out with phosphorus ions at a dose of $1.10^{13}$ atoms/cm$^2$ and an energy of 200 keV.

The following stage, according to a first variant of the process, consists of depositing a metallic layer 22 able to react with the polycrystalline silicon of layer 8 for forming a silicide. This metallic layer is in particular a 70 nm platinum layer deposited by cathodic sputtering.

Figure 4:
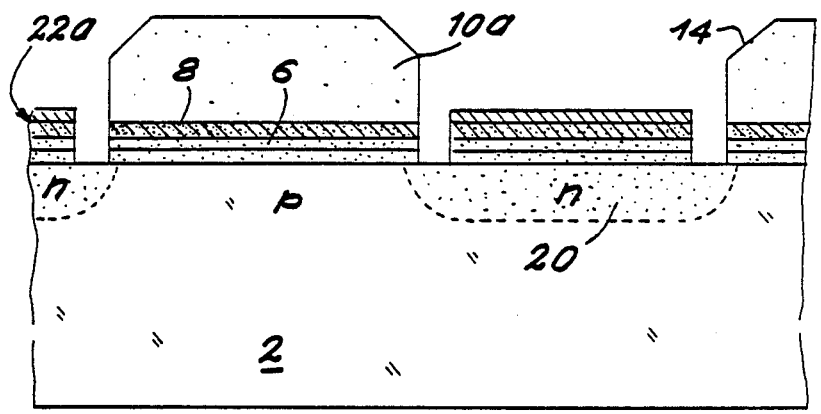

This is followed by an annealing of the structure at 500° C. for approximately 30 minutes so as to form the polycrystalline silicon of layer 8, not masked by mask 10a and spacers 18, the platinum silicide (PtSi) carrying the reference 22a in FIG. 4. This is followed by the selective elimination of the platinum which has not chemically reacted, i.e. the platinum in contact with the spacers 18 and the mask 10a, with respect to the PtSi and using aqua regia.

According to a second variant solely on the polycrystalline silicon of layer 8 not masked by mask 10a and the spacers is deposited a tungsten layer 22a using chemical vapour phase deposition (CVD or LPCVD) with a thickness of 100 nm. The tungsten is selectively deposited on the silicon and not on the silicon nitride or dioxide and consequently not on the spacers 18 or mask 10a.

This deposition technique is described in the publication by Miller et al in "Solid State Technology", Dec. 1982 and entitled "CVD Tungsten Interconnect and Contact Barrier Technology for VLSI".

The silicide or tungsten 22a will subsequently serve as an etching mask for the isolation trenches and mask 10a.

In the absence of $SiO_2$ 4 and $Si_3N_4$ 6 layers, the silicide 22a is formed by chemical reaction between layer 22 and the silicon of the substrate and the selective tungsten deposition takes place directly on the substrate. This is followed by the elimination of spacers 18 by an orthophosphoric acid solution ($H_3PO_4$).

The following stages of the process consist of successively eliminating the regions of the polycrystalline silicon layer 8, the regions of the silicon nitride layer 6 and those of the silicon dioxide layer 4 not covered with the silicon dioxide mask 10a and silicide or tungsten 22a. This can be carried out by successive reactive ionic etching operations using as the etching agent sulphurhexafluoride for layers 8 and 6 and $CHF_3$ for layer 4.

Figure 5:
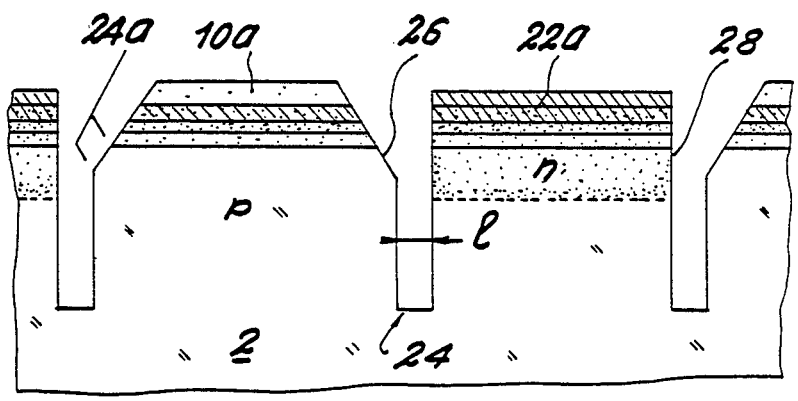

As shown in FIG. 5, this is followed by the etching of the regions of substrate 2 exposed during the preceding stage, in order to form the isolation trenches 24. Substrate etching takes place over a depth of approximately 4000 nm using a reactive ionic etching process which is selective with respect to the silicide or tungsten 22a. For this purpose, the etching agent is a mixture of $CCl_4$ and $Cl_2$.

According to the invention, the minimum width 1 of the trenches 24 is equal to the thickness e of the spacers (FIG. 3) and therefore close to 300 nm.

As a result of the use of spacers and the formation of the silicide or the selective deposition of tungsten 22a, the inventive process makes it possible to produce submicron isolation trenches 24, unlike in the known trench isolation process. The obtaining of submicron trenches makes it possible to considerably increase the integration density of the integrated circuit. Moreover, they are autopositioned with respect to the n and p regions of the integrated circuit.

As shown in FIG. 5, the following stage of the process consists of forming in the upper part 24a of the trenches 24 asymmetrical sides. The sides 26 in contact with the p regions are inclined with respect to the surface 3 of the substrate 2, whereas the sides 28 in contact with the n regions are perpendicular to said surface 3. The sides 26 are inclined in such a way that the section of the trenches is at a maximum level with the substrate surface 3.

In order to form these inclined sides 26, a simultaneous anisotropic etching of mask 10a and substrate 2 is carried out at identical etching speeds for mask 10a and the substrate. This can be carried out by using reactive ionic etching with an etching mixture constituted by $CHF_3$ and oxygen and over a thickness of approximately 500 nm. This etching agent does not make it possible to etch the silicide or tungsten 22a which will subsequently serve as an implantation mask for producing the p regions of the CMOS circuit.

Figure 6:
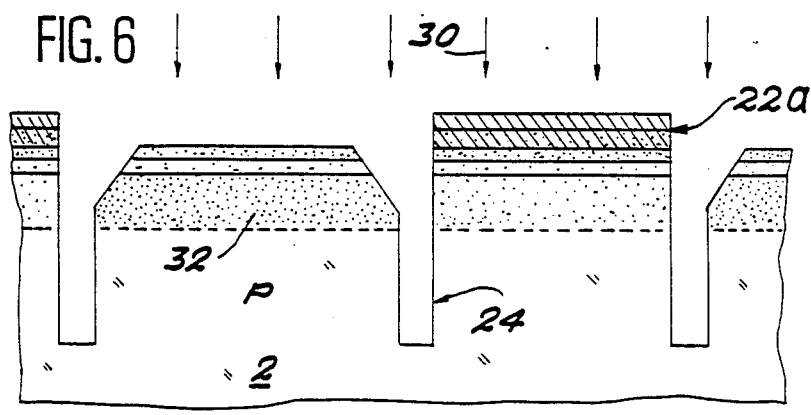

This is followed by the elimination of the silicon dioxide mask 10a by chemical etching using hydrofluoric acid, followed by the remainder of the polycrystalline silicon 8 by the action of a $SF_6$ plasma. The structure obtained is shown in FIG. 6.

This is followed by an implantation 30 of p type ions in order to form the p recesses 32, in which will be subsequently be produced the n channel transistors. Implantation 30 can be carried out with boron ions at a dose of $2.5 \cdot 10^{12}$ atoms/cm$^2$ and an energy of 60 keV. The platinum silicide 22a or tungsten serves as a mask for said implantation 30 and permits the autopositioning of p regions 32 with respect to trenches 24.

Figure 7:
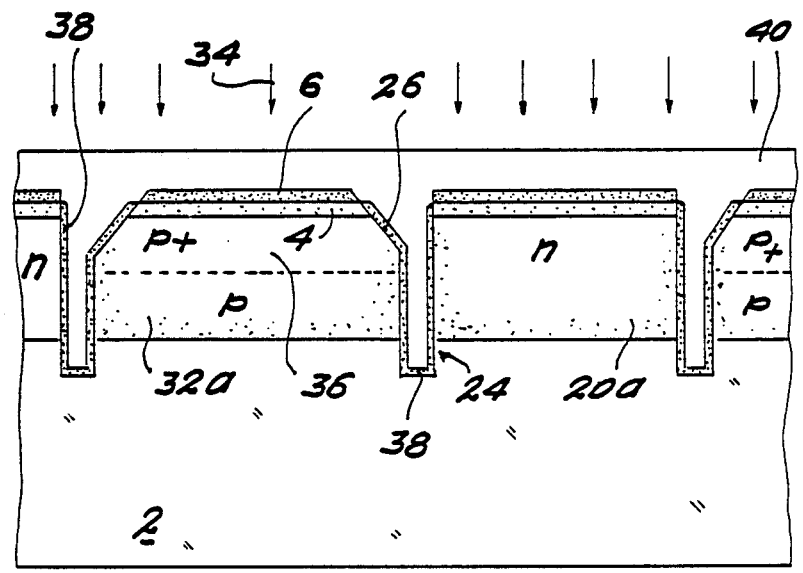

Following the elimination of the silicide or tungsten 22a, as shown in FIG. 7, by a solution based on nitric acid and hydrofluoric acid, annealing takes place at 1175° C. for approximately 5 hours, in order to diffuse into the substrate the implanted boron ions and phosphorus ions in order to respectively form the p recesses 32a and n recesses 20a.

The following stage of the process consists of performing an overdoping of the inclined sides 26 adjacent to the p recesses 32a in order to avoid electrical conductivity inversion on the sides of the isolation trenches 24, so that no parasitic channels are formed. This overdoping can be carried out by a $BF_2$ implantation 38 at a dose of $5 \cdot 10^{13}$ atoms/cm$^2$ and an energy of 40 keV, whereby it carries the reference 36 in FIG. 7.

This is followed by thermal oxidation of the structure at a temperature of approximately 900° C. This oxidation makes it possible to obtain an approximately 100 nm thick oxide film 38 more particularly covering the sides and bottom of the trench 24. This thermal oxidation makes it possible to improve the electrical isolation by isolation trenches.

Figure 8:
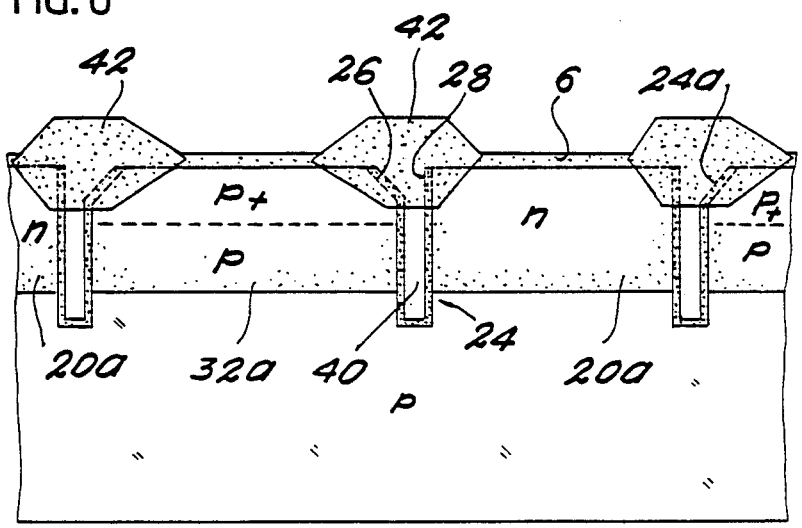

The trench is then filled with a material 40 constituted by polycrystalline silicon or a silicide (e.g. WSi$_2$). This filling is carried out by isotropic deposition and in particular by chemical vapour phase deposition (CVD or LPCVD), so as to completely fill the trenches 24. Following the filling of trenches 24, the excess filling material 40 located outside the trenches 24 is eliminated, so as to only leave material 40 within the trenches 24 and as shown in FIG. 8. This elimination is carried out by reactive ionic, solid plate dry etching using CCl$_4$ as the selective etching agent with respect to the silicon nitride layer 6.

The local field oxide 42 is then produced in conventional manner by forming on the complete structure a lithography mask protecting the active regions of the circuit (particularly transistors), by etching the nitride layer 6 for eliminating therefrom the unmasked regions, by eliminating the lithography mask and then thermally oxidizing at 950° C. the trench filling material 40, together with the substrate regions exposed during the etching of the nitride, the etched silicon nitride layer 6 serving for localizing said field oxide 42. The thickness of said oxide is approximately 600 nm.

Finally, the silicon nitride layer 6 is eliminated, e.g. by chemical etching using orthophosphoric acid. The final structure of the CMOS circuit is as shown in FIG. 8.

As a result of the inventive process, the local field oxide 42 is autopositioned with respect to the isolation trenches 24, which contributes to significantly increasing the integration density of the CMOS integrated circuits.

The n channel transistors and p channel transistors of the CMOS circuit can then be produced in conventional manner respectively in the p and n recesses 32a and 20a.

The above description related to a realization in which only a single resin mask was used for positioning the n recesses and the p recesses, so that they are autopositioned. Moreover, the isolation trenches are autopositioned with respect to the n and p recesses. However, it is possible to use several lithographic resin masks not autopositioned with respect to the n and p regions for the purpose of realizing the invention and as represented in FIGS. 9 to 11.

Following the realization of the p and/or n regions 32a and 20a respectively in known manner (complimentary lithographic masks, ion implantation and annealing), there is a successive deposition of the layers 4, 5 and 8 of SiO$_2$, Si$_3$N$_4$ and polycrystalline Si, as described hereinbefore. Using conventional photolithography procedures, this is followed by the production of a resin mask 44, whose patterns 44a mask the n regions.

This is followed by anisotropic etching of the polycrystalline silicon layer 8 leading to the elimination of the unmasked regions of layer 8 and as shown in FIG. 9. This reactive ionic etching uses CCl$_4$ as the etching agent.

Following the elimination of resin mask 44, mask 22a is formed either from silicide by the chemical reaction of a metal with layer 8, or by selective deposition of tungsten, as described relative to FIGS. 3 and 4, on the n regions 20a. The SiO$_2$ layer 10 is then deposited, as described in FIG. 1, on the complete structure.

This is followed by the production of the resin mask 12, whereof the patterns partly mask the p regions, followed by the simultaneous etching of mask 12 and the SiO$_2$ layer, as described hereinbefore, for forming an etched SiO$_2$ layer 10a having in its upper part 11 inclined sides 14. The regions of the nitride layer 6 and those of the SiO$_2$ layer 4 not covered with masks 10a and 22 are then eliminated. The rest of the process is identical to that described hereinbefore with reference to FIGS. 5 to 8 with the exception of the implantation of the p ions serving for the formation of the p recesses 32a.

According to the invention, the spaces 46 between two patterns 10a and 22a fix the position of the isolation trenches 24, as well as the width 1 of said trenches.

According to the invention, it is possible to use a metallic compound as mask 22a in place of the tungsten or silicide, the important point being that the mask 22a does not erode or only erodes very slightly on etching the resin mask 12 and the silicon dioxide layer 10. The metallic compound usable according to the invention can be alumina. The latter must be directly deposited on the nitride layer 6 by lift-off (production of a resin mask masking the p regions 32a, deposition of alumina on the complete structure and elimination of the mask and the alumina covering the resin).

No matter which embodiment of the invention is used, the resin mask 12 masking the p regions and the "mask" 22a of silicide or tungsten masking the n regions are complimentary or autopositioned. In other words, the position of the patterns 12 and therefore that of the patterns 10a fix that of the patterns 22a (FIGS. 1 to 4) or conversely the position of patterns 22a fixes that of the patterns of mask 12 and therefore that of patterns 10a (FIGS. 9 to 11).

I claim:

1. A process for the production of electrical isolation zones serving to isolate the n regions from the p regions of a CMOS integrated circuit formed in a silicon substrate comprising the steps of:
    (a) producing a first mask on the substrate having first patterns masking at least partly the p regions and whose sides have in their upper part an inclined profile,
    (b) producing a second mask on the substrate having second patterns masking at least partly the n regions, the first mask, being selectively etchable with respect to the second mask, the first and second patterns being spaced and defining between them the location of electrical isolation trenches to be produced,
    (c) etching the unmasked substrate regions for forming said trenches,
    (d) transferring the inclined profile of the first patterns in the substrate by etching the first mask for forming, in the upper part of the trenches, inclined sides in contact with the p regions, the section of the trenches widening towards the upper surface of the substrate.

2. Process according to claim 1, characterized in that the second mask is of metal or silicide.

3. Process according to claim 1, characterized in that the isolation trenches are filled with an isolating material, 4. Process according to claim 1, characterized in that it comprises the following stages:

(a') producing the first mask on the upper surface of the substrate, whose patterns mask the substrate regions which will serve as the p regions, (b') etching the patterns of the first mask so that their sides have an inclined profile in their upper part, (c') forming spacers on each inclined side of the first mask patterns, (d') depositing a silicide solely above the regions of the substrate not covered by the first mask and the spacers, (e') eliminating the spacers, (f') etching the regions of the substrate exposed during the preceding stage in order to form trenches, (g') transferring the inclined profile of the first patterns in the substrate by etching the first mask for forming, in the upper part of the trenches, inclined sides in contact with the p regions, the section of the trenches widening towards the upper surface of the substrate, (h') filling the trenches with an isolating material.

5. Process according to claim 4, characterized in that the silicide is formed above the unmasked substrate regions by depositing on the structure obtained in step e' a metal layer (22) able to form a silicide (22a), forming a silicide (22a) from said metal solely above the unmasked substrate regions and eliminating the metal (22) which has not formed silicide (22a).

6. Process according to claim 1, comprising the following stages:

(1) depositing a protective layer on the upper surface of the substrate, (2) depositing a polycrystalline silicon layer on the protective layer, (3) producing the first mask on the silicon layer whose patterns mask the substrate regions which will serve as the p regions, (4) etching the patterns of the first mask so that their sides have an inclined profile in their upper part, (5) forming spacers on each inclined side of the first mask patterns, (6) depositing a silicide solely above the regions of the substrate not covered by the first mask and the spacers, (7) eliminating the spacers, (8) etching the regions of the silicon layer exposed during the preceding stage, (9) etching the regions of the protective layer exposed during the preceding stage,

(10) etching the regions of the substrate exposed during the preceding stage in order to form trenches,

(11) transferring the inclined profile of the first patterns in the substrate by etching the first mask for forming, in the upper part of the trenches, inclined sides in contact with the p regions, the section of the trenches widening towards the upper surface of the substrate,

(12) filling the trenches with an isolating material.

7. Process according to claim 1, characterized in that a p type doping takes place in the inclined sides of the trenches.

8. Process according to claim 4, characterized in that n ion implantation takes place between stages c' and d' for forming the n regions.

9. Process according to claim 4, characterized in that between stages g' and h' p ion implantation takes place for forming the p regions.

10. Process according to claim 8 or 9, characterized in that, after implantation, an annealing takes place for diffusing the implanted ions into the substrate.

11. Process according to claim 4, characterized in that the remainder of the first mask and the silicide is eliminated by etching between stages g' and h'.

12. Process according to claim 6, characterized in that said silicide is formed by depositing on the structure obtained in step (5) a metal layer able to form a silicide, forming a silicide by the reaction of said metal and the polycrystalline silicon at high temperature in the unmasked polycrystalline silicon layer regions, and eliminating the metal which has not formed silicide.

13. Process according to claim 5 or 6, characterized in that the metal is chosen from among platinum and palladium.

14. Process according to claim 1, characterized in that the first mask and the substrate are etched anisotropically at identical etching speeds for the first mask and the substrate.

15. Process according to claim 4, characterized in that a thermal oxidation of the substrate takes place leading to the formation of an oxide film on the sides and bottom of the trenches.

16. Process according to claim 4, characterized in that, after stage h', a local field oxide is produced above each trench.

17. Process according to claim 1, comprising the following stages:

(a') producing the first mask on the upper surface of the substrate, whose patterns mask the substrate regions which will serve as the p regions, (b') etching the patterns of the first mask so that their sides have an inclined profile in their upper part, (c') forming spacers on each side of the first mask patterns, (d') depositing a metal solely above the regions of the substrate not covered by the first mask and the spacers, (e') eliminating the spacers, (f') etching the regions of the substrate exposed during the preceding stage in order to form trenches, (g') transferring the inclined profile of the first patterns in the substrate by etching the first mask for forming, in the upper part of the trenches, inclined sides in contact with the p regions, the section of the trenches widening towards the upper surface of the substrate, (h') filling the trenches with an isolating material.

18. Process according to claim 17, characterized in that the spacers and first mask are respectively made from silicon nitride and silicon oxide and in that the metal is tungsten deposited selectively by chemical vapor phase deposition.

19. Process according to claim 17, characterized in that the spacers and the first mask are made respectively from silicon oxide and silicon nitride and in that the metal is tungsten deposited selectively by chemical vapor phase deposition.

20. Process according to claim 17, characterized in that n ion implantation takes place between stages c' and d' for forming the n regions.

21. Process according to claim 17, characterized in that between stages g' and h' p ion implantation takes place for forming the p regions.

22. Process according to claim 20 or 21, characterized in that after implantation, an annealing takes place for diffusing the implanted ions into the substrate.

23. Process according to claim 17, characterized in that, a protective layer and then a polycrystalline silicon layer is deposited on the substrate before stage a', in that regions of said protective layer and then of the silicon layer are exposed during stage e' and then eliminated.

24. Process according to claim 17, characterized in that a thermal oxidation of the substrate takes place leading to the formation of an oxide film on the sides and bottom of the trenches.

25. Process according to claim 17, characterized in that, after stage h', a local field oxide is produced above each trench.

26. Process according to claim 17, characterized in that the remainder of the first mask and the metal is eliminated by etching between stages g' and h'.

* * * * *

UNITED STATES PATENT AND TRADEMARK OFFICE
CERTIFICATE OF CORRECTION

PATENT NO. : 4,889,828
DATED : DECEMBER 26, 1989
INVENTOR(S) : PIERRE JEUCH

It is certified that error appears in the above-identified patent and that said Letters Patent is hereby corrected as shown below:

ON TITLE PAGE:

In line 1, of the Assignee, delete "Commissiriat" and insert --Commissariat--.

Signed and Sealed this

Eighth Day of October, 1991

Attest:

HARRY F. MANBECK, JR.

*Attesting Officer*  *Commissioner of Patents and Trademarks*